US012444582B2

(12) United States Patent
Akashi

(10) Patent No.: US 12,444,582 B2
(45) Date of Patent: Oct. 14, 2025

(54) PLASMA PROCESSING APPARATUS

(71) Applicant: Hitachi High-Tech Corporation, Tokyo (JP)

(72) Inventor: Shoji Akashi, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 17/278,394

(22) PCT Filed: Apr. 21, 2020

(86) PCT No.: PCT/JP2020/017190
§ 371 (c)(1),
(2) Date: Mar. 22, 2021

(87) PCT Pub. No.: WO2021/214868
PCT Pub. Date: Oct. 28, 2021

(65) Prior Publication Data

US 2023/0033655 A1 Feb. 2, 2023

(51) Int. Cl.
*H01J 37/32* (2006.01)

(52) U.S. Cl.
CPC .... *H01J 37/32678* (2013.01); *H01J 37/3244* (2013.01); *H01J 37/32082* (2013.01); *H01J 2237/3344* (2013.01)

(58) Field of Classification Search
None
See application file for complete search history.

(56) References Cited

U.S. PATENT DOCUMENTS 2,981,287 A 4/1961 Caslow
3,452,781 A 7/1969 Napolitano
(Continued)

FOREIGN PATENT DOCUMENTS

CN 109559968 A * 4/2019 ........ H01J 37/32091
JP S6214429 A 1/1987
(Continued)

OTHER PUBLICATIONS

Search Report mailed Jun. 23, 2020 in corresponding International Application No. PCT/JP2020/017190.
(Continued)

*Primary Examiner* — Sylvia MacArthur
(74) *Attorney, Agent, or Firm* — Miles & Stockbridge, P.C.

(57) ABSTRACT

Provided is a plasma processing apparatus that controls the radical distribution on a wafer and prevents particles from flying up on an upper surface of a second shielding plate during isotropic etching. The plasma processing apparatus includes a processing chamber 106 in which a sample is subjected to plasma-processing, a radio frequency power source 113 that supplies radio frequency power for generating plasma, a sample stage 120 on which the sample is placed, and a first flat plate 115 arranged above the sample stage 120 and having a plurality of through holes 170, a second flat plate 116 arranged between the first flat plate 115 and the sample stage 120 and facing the first flat plate 115, and a gas supply port 150 arranged on a side surface of the processing chamber 106 between the first flat plate 115 and the second flat plate 116 to supply gas. The through holes 170 are arranged outside a portion separated from a center by a predetermined distance.

8 Claims, 9 Drawing Sheets

(56) References Cited

U.S. PATENT DOCUMENTS

| | | | |
|---|---|---|---|
| 3,760,843 | A | 9/1973 | Larner |
| 4,450,031 | A | 5/1984 | Ono et al. |
| 4,638,837 | A | 1/1987 | Buike et al. |
| 4,669,404 | A | 6/1987 | Yoneda |
| 4,844,767 | A | 7/1989 | Okudaira et al. |
| 4,960,073 | A | 10/1990 | Suzuki et al. |
| 5,178,962 | A | 1/1993 | Miyamoto et al. |
| 5,284,544 | A | 2/1994 | Mizutani et al. |
| 5,992,460 | A | 11/1999 | Akimoto |
| 5,998,986 | A | 12/1999 | Ido |
| 6,082,406 | A | 7/2000 | Williamson, Jr. et al. |
| 6,145,541 | A | 11/2000 | Hirota |
| 6,192,937 | B1 | 2/2001 | Fagerlie et al. |
| 6,287,980 | B1 | 9/2001 | Hanazaki et al. |
| 6,867,086 | B1 | 3/2005 | Chen et al. |
| 10,121,686 | B2 | 11/2018 | Ogawa et al. |
| 2002/0106845 | A1 | 8/2002 | Chao et al. |
| 2003/0212507 | A1 | 11/2003 | Wei et al. |
| 2004/0129671 | A1 | 7/2004 | Ji et al. |
| 2007/0163477 | A1 | 7/2007 | Nagata et al. |
| 2008/0078505 | A1 | 4/2008 | Kofuji et al. |
| 2008/0110400 | A1 | 5/2008 | Satou et al. |
| 2008/0178805 | A1 | 7/2008 | Paterson et al. |
| 2009/0008034 | A1 | 1/2009 | Tahara et al. |
| 2011/0120649 | A1 | 5/2011 | Satou et al. |
| 2012/0064726 | A1 | 3/2012 | Nozawa et al. |
| 2012/0231553 | A1 | 9/2012 | Okita et al. |
| 2012/0255617 | A1 | 10/2012 | Miyazoe et al. |
| 2013/0023125 | A1 | 1/2013 | Singh |
| 2013/0270625 | A1 | 10/2013 | Jang et al. |
| 2013/0319615 | A1 | 12/2013 | Cho et al. |
| 2014/0057447 | A1 | 2/2014 | Yang et al. |
| 2014/0134842 | A1 | 5/2014 | Zhang et al. |
| 2015/0011093 | A1 | 1/2015 | Singh et al. |
| 2015/0083582 | A1 | 3/2015 | Dhindsa et al. |
| 2015/0206774 | A1 | 7/2015 | Singh |
| 2015/0330519 | A1 | 11/2015 | Maurer et al. |
| 2016/0177443 | A1 | 6/2016 | Kumar et al. |
| 2016/0372299 | A1 | 12/2016 | Kubota et al. |
| 2016/0379857 | A1 | 12/2016 | Ogawa et al. |
| 2018/0047595 | A1 | 2/2018 | Kofuji et al. |
| 2018/0290168 | A1* | 10/2018 | Han .................. C23C 16/45565 |
| 2021/0233747 | A1* | 7/2021 | Yamaguchi ............. H01L 21/67 |
| 2023/0033655 | A1* | 2/2023 | Akashi .............. H01J 37/32678 |

FOREIGN PATENT DOCUMENTS

| | | | | | |
|---|---|---|---|---|---|
| JP | H2230729 | A | | 9/1990 | |
| JP | H03218018 | A | | 9/1991 | |
| JP | H04180621 | A | | 6/1992 | |
| JP | H04225226 | A | | 8/1992 | |
| JP | H0507763 | A | | 1/1993 | |
| JP | H05234947 | A | | 9/1993 | |
| JP | H08107101 | A | | 4/1996 | |
| JP | 2000306884 | A | | 11/2000 | |
| JP | 200185342 | A | | 3/2001 | |
| JP | 2001319882 | A | | 11/2001 | |
| JP | 2003229419 | A | | 8/2003 | |
| JP | 2008091651 | A | | 4/2008 | |
| JP | 2008124190 | A | * | 5/2008 | .......... H01J 37/3244 |
| JP | 2009016453 | A | | 1/2009 | |
| JP | 201021166 | A | | 1/2010 | |
| JP | 2010512031 | A | | 4/2010 | |
| JP | 2013214583 | A | | 10/2013 | |
| JP | 2013251546 | A | | 12/2013 | |
| JP | 201550362 | A | | 3/2015 | |
| JP | 2015065434 | A | | 4/2015 | |
| JP | 2015173182 | A | | 10/2015 | |
| JP | 2016145412 | A | | 8/2016 | |
| JP | 2017168589 | A | | 9/2017 | |
| JP | 2017228791 | A | | 12/2017 | |
| JP | 2019176184 | A | | 10/2019 | |
| JP | 2020004782 | A | * | 1/2020 | |
| JP | 2020123685 | A | * | 8/2020 | |
| KR | 20050099723 | A | | 10/2005 | |
| KR | 1020080020027 | A | * | 3/2008 | |
| KR | 20080086172 | A | | 9/2008 | |
| KR | 20170101952 | A | | 9/2017 | |
| KR | 20170108916 | A | | 9/2017 | |
| TW | 544805 | B | | 8/2003 | |
| TW | 201009882 | A | | 3/2010 | |
| TW | 201234474 | A | | 8/2012 | |
| TW | 201417172 | A | | 5/2014 | |
| TW | 201428848 | A | | 7/2014 | |
| TW | 201517162 | A | | 5/2015 | |
| TW | 201642713 | A | | 12/2016 | |
| WO | 2005104203 | A1 | | 11/2005 | |
| WO | 2016121075 | A1 | | 8/2016 | |
| WO | 2016190036 | A1 | | 12/2016 | |

OTHER PUBLICATIONS

Written Opinion mailed Jun. 23, 2020 in corresponding International Application No. PCT/JP2020/017190.

Office Action mailed Mar. 14, 2022 in Korean Application No. 10-2021-7001575.

Office Action mailed Dec. 7, 2021 in Taiwanese Application No. 110103927.

* cited by examiner

[FIG. 1]
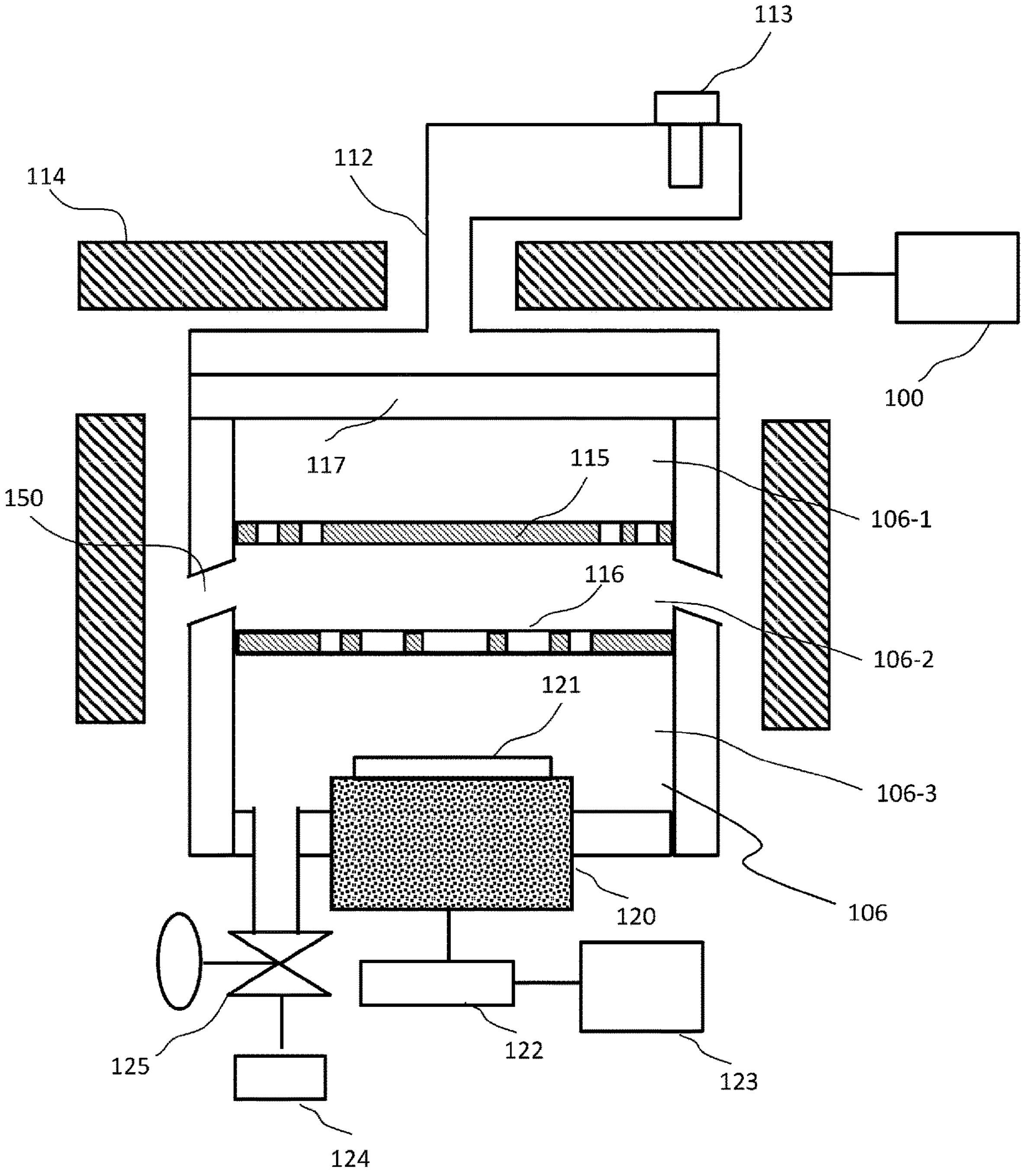

[FIG. 2]
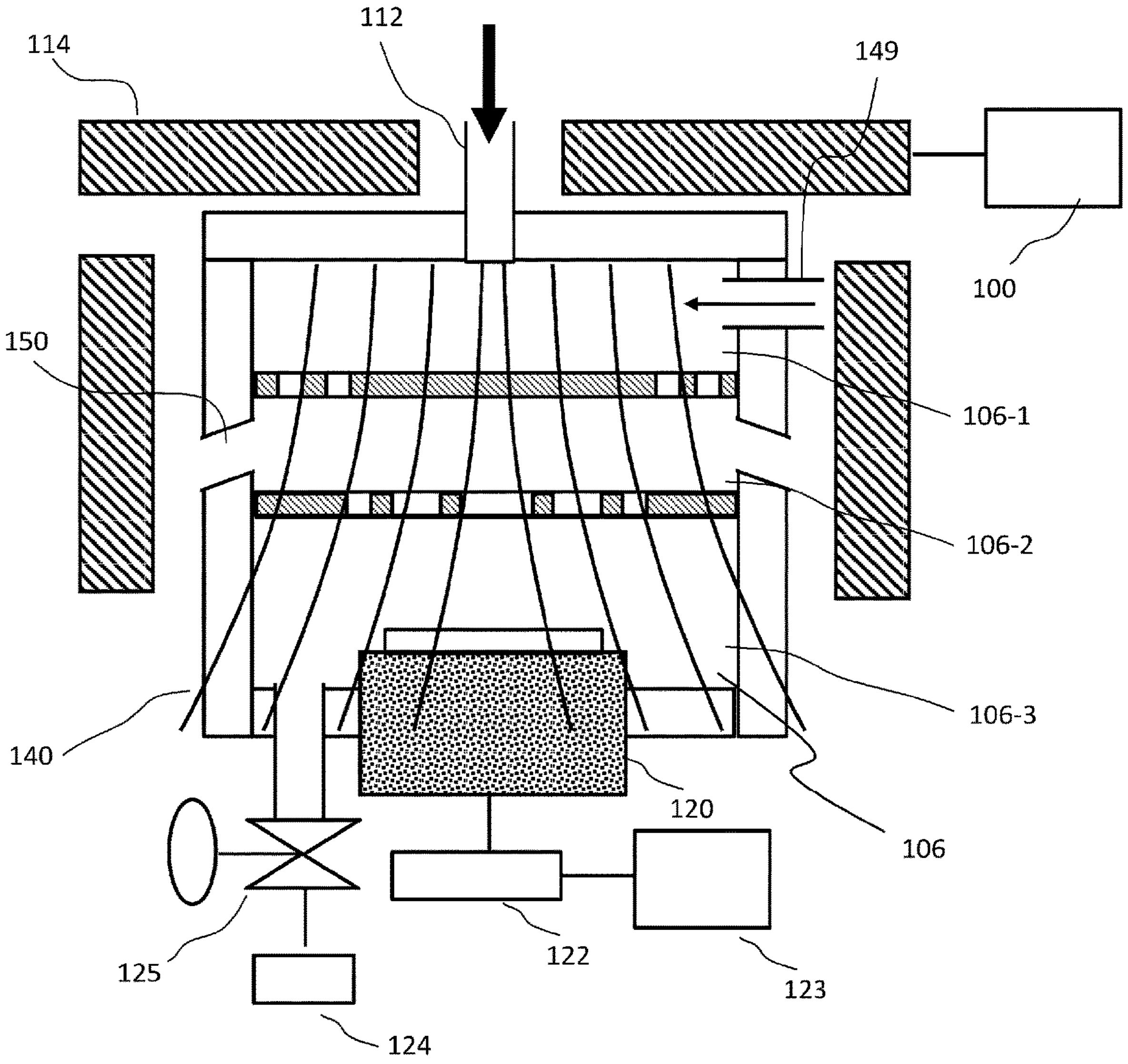

[FIG. 3]
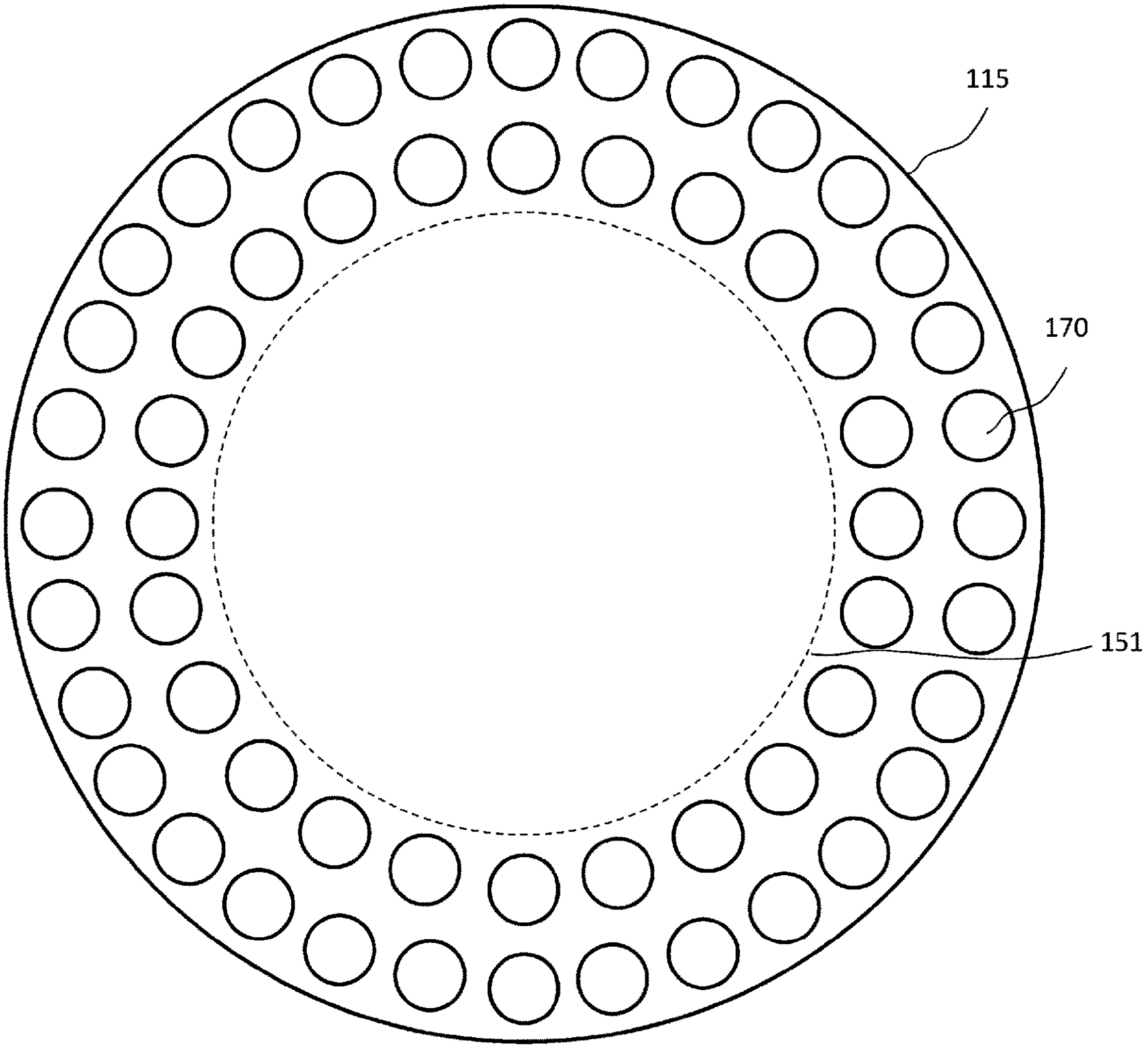

[FIG. 4]
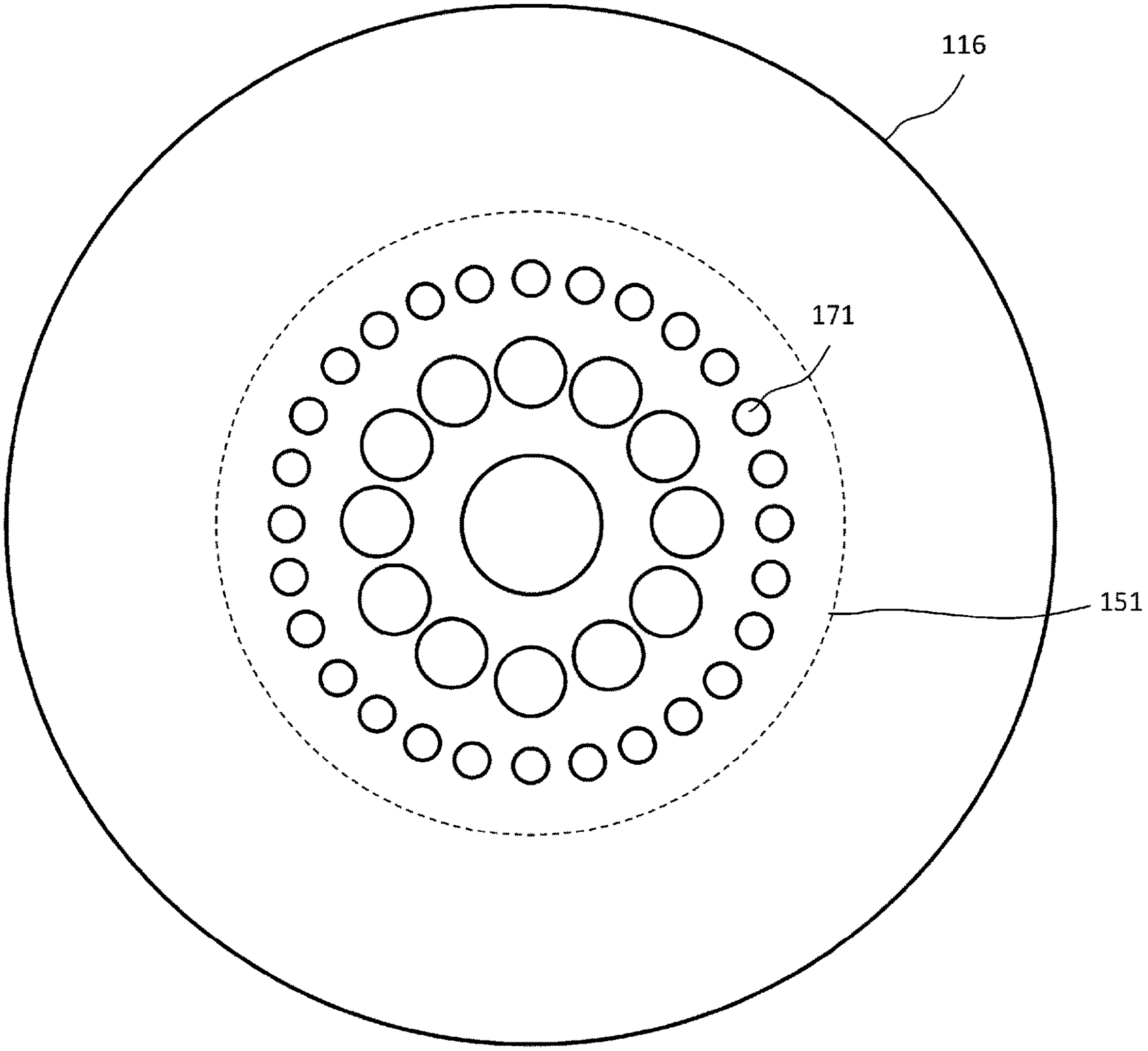

[FIG. 5]
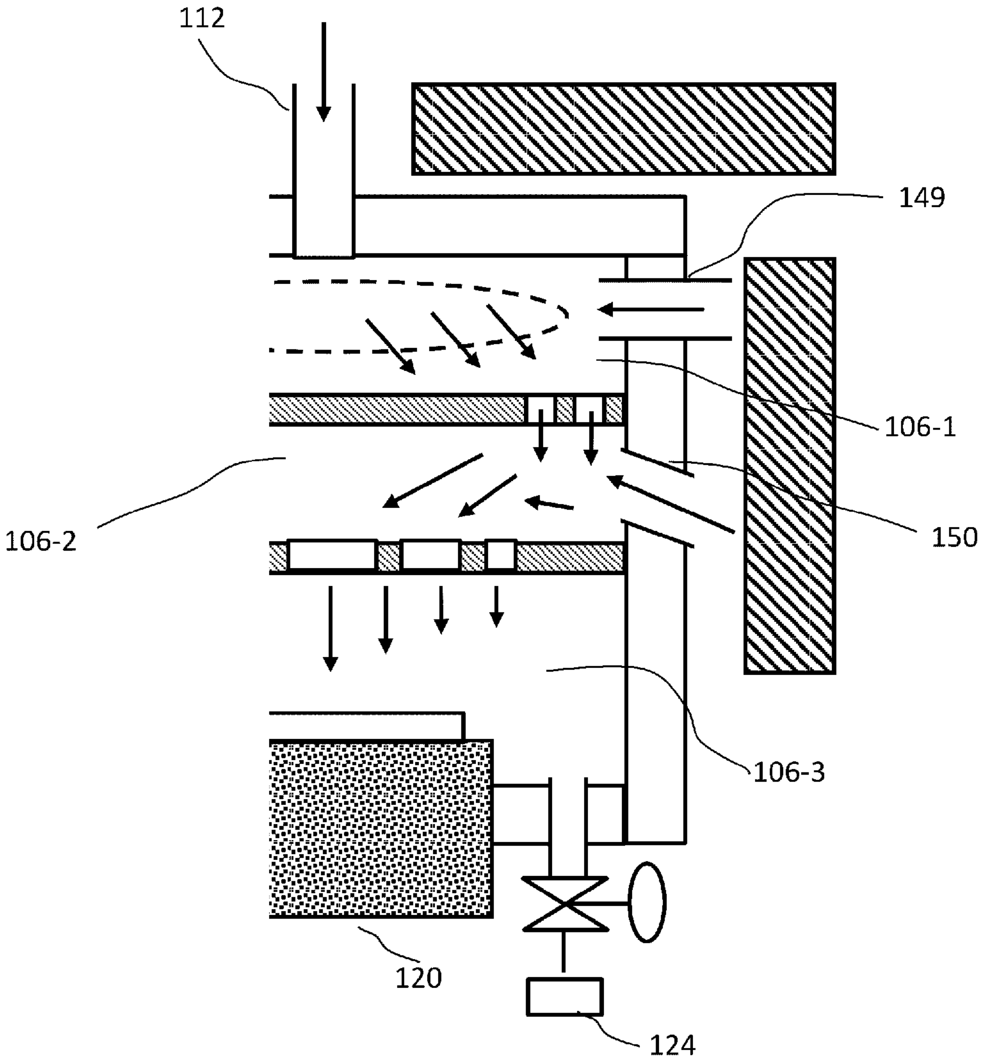

[FIG. 6A]
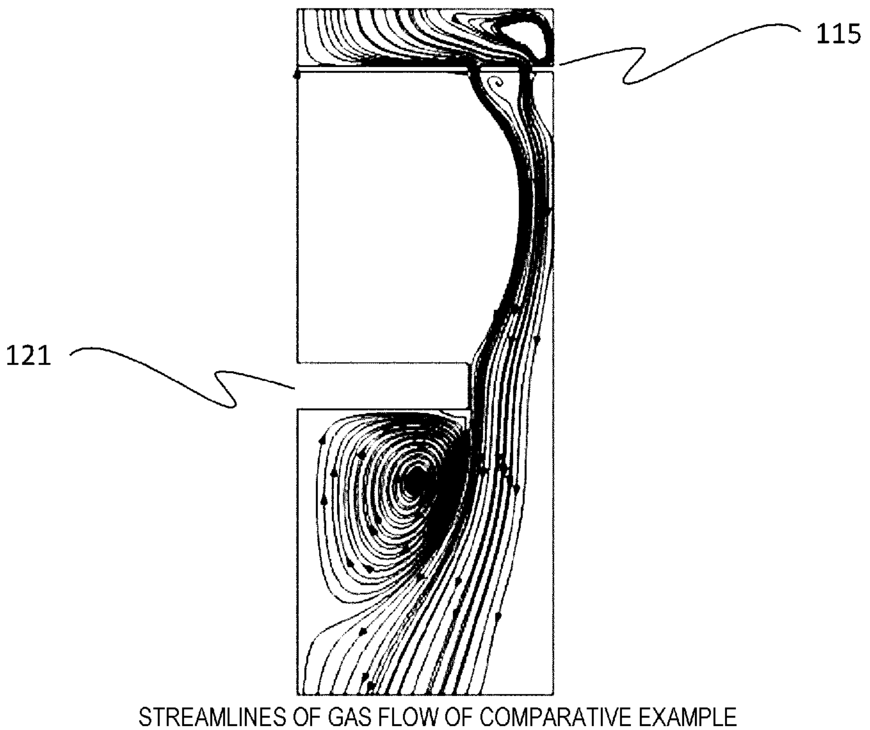
STREAMLINES OF GAS FLOW OF COMPARATIVE EXAMPLE
[FIG. 6B]
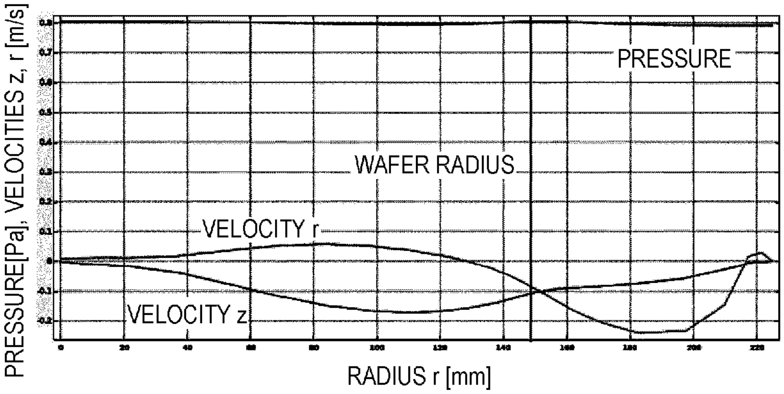

[FIG. 7A]
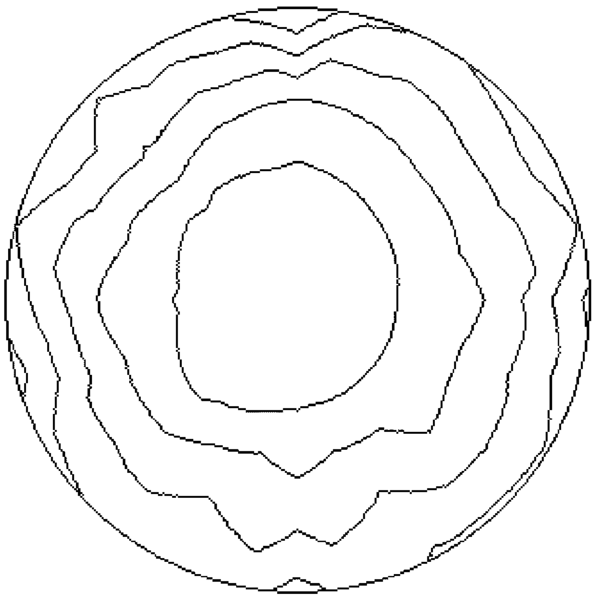
[FIG. 7B]
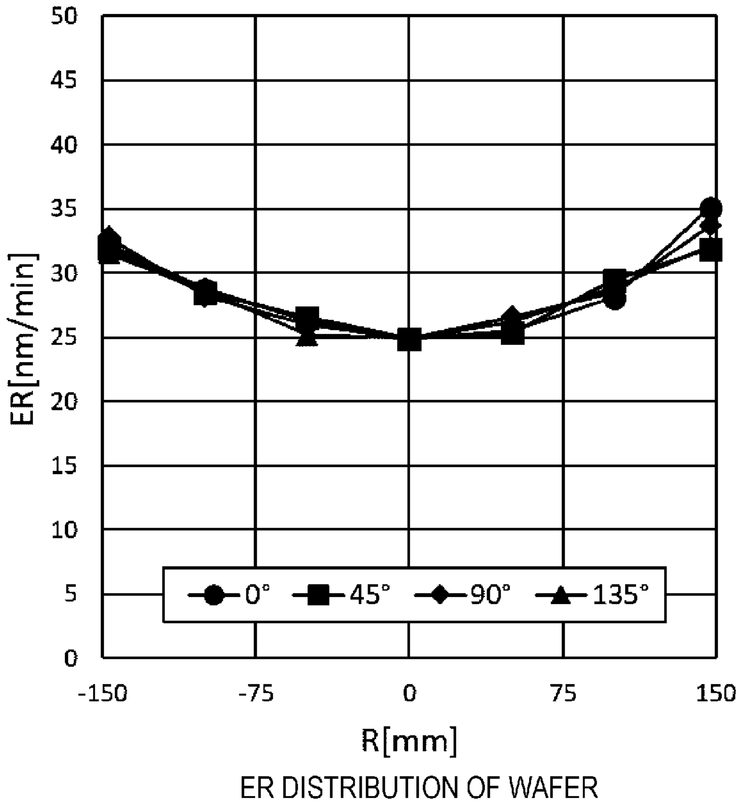
ER DISTRIBUTION OF WAFER

[FIG. 8A]
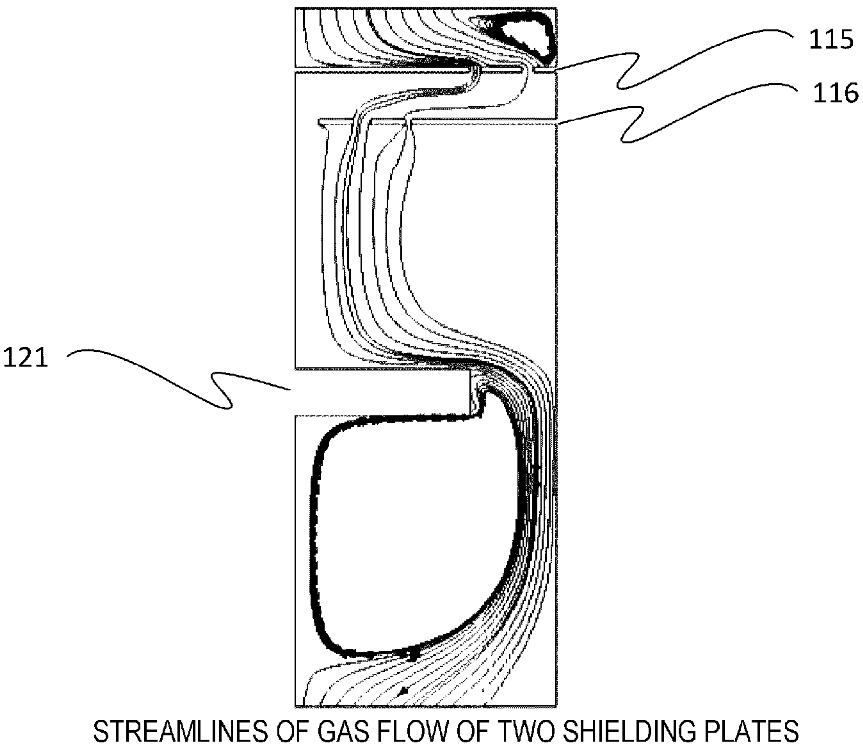
STREAMLINES OF GAS FLOW OF TWO SHIELDING PLATES
[FIG. 8B]
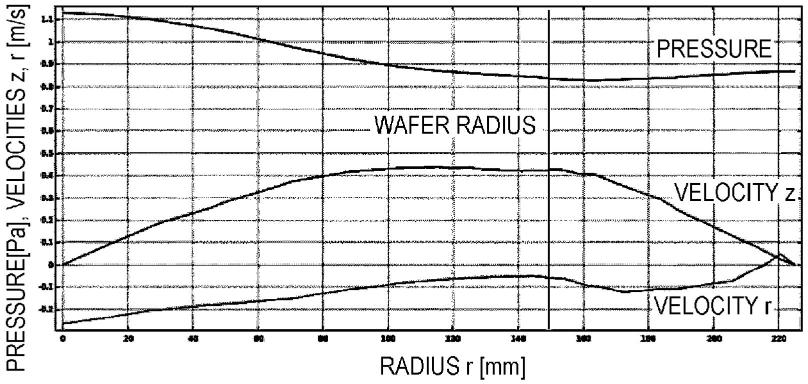

[FIG. 9A]
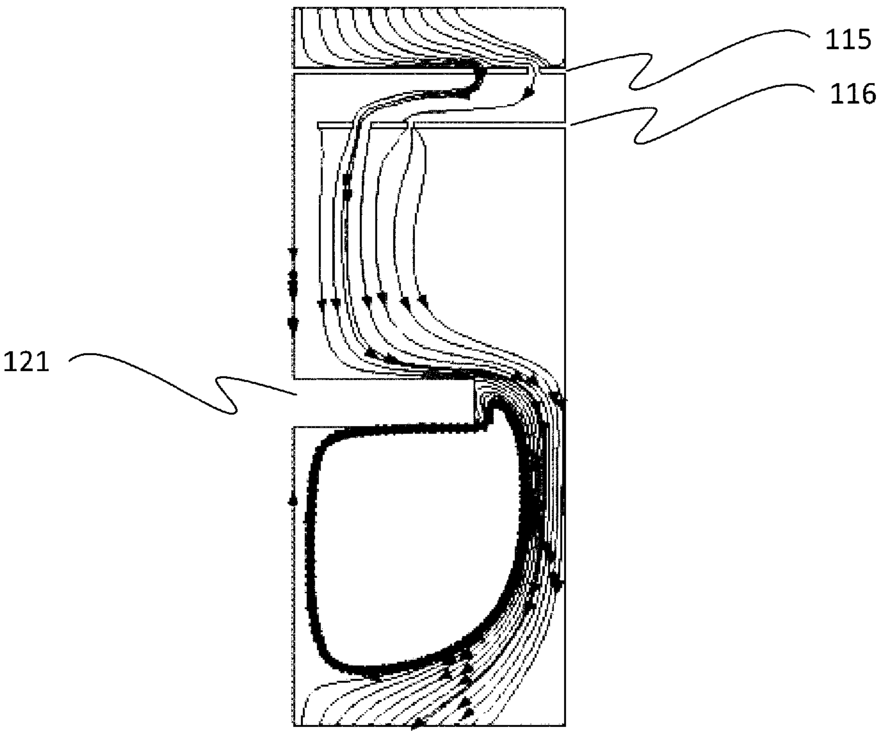
STREAMLINES OF GAS FLOW OF TWO SHIELDING PLATES + SECOND GAS FLOW STRUCTURE
[FIG. 9B]
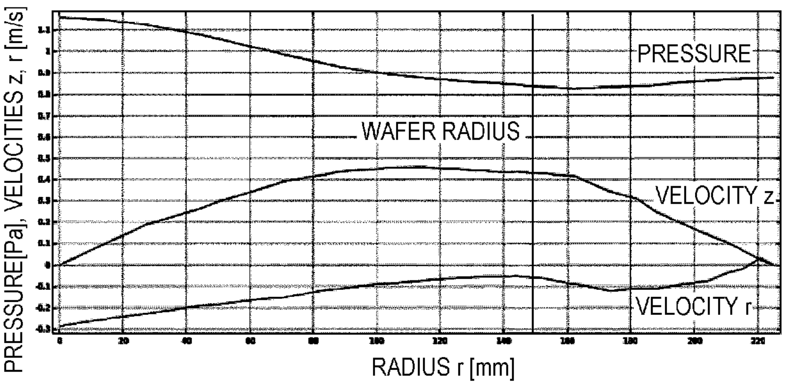

PLASMA PROCESSING APPARATUS

TECHNICAL FIELD

The present invention relates to a plasma processing apparatus.

BACKGROUND ART

In a manufacturing process of a semiconductor device, there is a demand for miniaturization and integration of components included in a semiconductor apparatus. For example, in an integrated circuit or a nano-electromechanical system, nanoscaling of a structure is further promoted.

In general, in the manufacturing process of the semiconductor device, a lithography technique is used to form a fine pattern. In this technique, a pattern of a device structure is applied on a resist layer, and a substrate exposed by the pattern on the resist layer is selectively etching-removed. In a subsequent processing process, an integrated circuit can be formed by depositing another material in an etching region.

A dry etching apparatus is used for performing etching. For example, Patent Literature 1 discloses a dry etching apparatus having both a function of radiating both ions and radicals and a function of shielding ions and radiating only radicals. In addition, Patent Literature 2 discloses a dry etching apparatus capable of generating an inductively coupled plasma by supplying radio frequency power to a helical coil.

Capacitively coupled plasma can be generated between a metal porous plate and a sample by switching from a first radio frequency power source arranged in a first plasma generation unit to a second radio frequency power source which is arranged in a second plasma generation unit and supplies radio frequency power to a sample stage on which the sample is placed. By adjusting the ratio of electric power supplied to the helical coil and electric power supplied to the sample, the ratio of radicals and ions can be adjusted.

In addition, Patent Literature 3 discloses an electron cyclotron resonance (ECR) plasma type dry etching apparatus capable of generating plasma by utilizing a magnetic field generated by a solenoid coil and an ECR phenomenon of a microwave of 2.45 GHz. In this dry etching apparatus, a DC bias voltage is generated by applying radio frequency power to a sample, and ions can be accelerated by this DC bias voltage to irradiate a wafer.

In addition, Patent Literature 4 discloses a plasma processing apparatus serving as a dry etching apparatus capable of shielding ions generated from plasma by providing a partition wall member separating a plasma generation chamber and a processing chamber. In the dry etching apparatus, by constituting the partition wall member with an insulating portion material that does not allow ultraviolet light to pass through, the ultraviolet light can be shielded and only hydrogen radicals can be supplied to the processing chamber.

In addition, Patent Literature 5 discloses a dry etching apparatus serving as an atomic layer etching apparatus capable of replacing radicals with an inert gas by a supplied second etching gas. In the dry etching apparatus, radicals can be generated from the replaced inert gas to perform etching.

CITATION LIST

Patent Literature

PTL 1: JP-A-2019-176184
PTL 2: JP-A-2015-50362

PTL 3: JP-S-62-14429
PTL 4: JP-A-2009-016453
PTL 5: JP-A-2017-228791
PTL 6: JP-A-2010-21166

SUMMARY OF INVENTION

Technical Problem

When performing such an atomic layer etching by a method in the related art, it is necessary to alternately move and process a sample between (1) an apparatus capable of irradiating the sample with only radicals and (2) an apparatus capable of accelerating ions in plasma and irradiating the sample as described in Patent Literature 3, etc. by vacuum transfer. Therefore, in the atomic layer etching by the method in the related art, there is a problem to be solved that a throughput is significantly reduced. Therefore, it is desired to perform both a first step of irradiating the sample with only radicals and a second step of irradiating the sample with ions using one dry etching apparatus.

In addition, for example, in an isotropic processing of silicon, it is necessary to radiate both ions and radicals to remove a natural oxide film on a silicon surface, and then radiate only radicals to perform an isotropic etching of silicon. In such processing, since time required to remove the natural oxide film is as short as several seconds, the throughput will be significantly reduced when removal of the natural oxide film and the isotropic etching of silicon are processed by separate apparatuses. Therefore, it is desired to perform both the removal of the natural oxide film by radiating both ions and radicals and the isotropic etching of silicon using only radicals with one dry etching apparatus.

In addition, for example, in a medium-scale semiconductor manufacturing process aimed at small-scale multi-product production, since one dry etching apparatus performs a plurality of processes, the apparatus cost can be significantly reduced by providing a dry etching apparatus with functions of both anisotropic etching of radiating both ions and radicals and the isotropic etching of radiating only radicals.

In view of such circumstances, a dry etching apparatus used in semiconductor device processing has been required to have both a function of radiating both ions and radicals for processing and a function of radiating only radicals for processing.

In the related art, in order to meet such a requirement, the dry etching apparatus of Patent Literature 1 was expected.

The reason is that in such a dry etching apparatus, in a radical irradiation of the first step, the radio frequency power of a microwave is supplied to generate ECR plasma, and the plasma can be generated on a shielding plate by controlling a magnetic field formation mechanism. As a result, the shielding plate shields radiation of ions so that only radicals are supplied to the sample from the ECR plasma. However, in order to irradiate the sample with radicals by such a dry etching apparatus, it is necessary to supply radicals generated in an upper portion region of the processing chamber through holes penetrating an outer peripheral portion of the shielding plate. Therefore, radicals are insufficient at a center portion of the wafer, and an etching rate of the wafer becomes high on the outer circumference, which causes non-uniformity in processing.

In addition, there is a problem to be solved that the dry etching apparatus disclosed in Patent Literature 1 can supply radicals from the plasma generated in the upper portion region from the center of the shielding plate by a second shielding plate, but does not have a function of actively controlling a gas flow.

In addition, there is a problem to be solved that the dry etching apparatus disclosed in Patent Literature 5 supplies a second gas after the etching by the first gas is completed, but does not positively control a gas flow of the first etching gas. In the dry etching apparatus, the second gas merely replaces a product of the first gas.

Furthermore, although Patent Literature 6 discloses a technique in which through holes of two shielding plates are shifted by half a pitch so that they do not overlap each other, there is a problem that such processing of shielding plates is costly.

Therefore, an object of the invention is to provide a plasma processing apparatus capable of implementing both a radical irradiation and an ion irradiation with one apparatus and of controlling the radical irradiation between a first shielding plate and a second shielding plate.

Solution to Problem

In order to achieve the above-mentioned object, atypical plasma processing apparatuses according to the invention includes: a processing chamber in which a sample is subjected to plasma-processing; a radio frequency power source that supplies radio frequency power for generating plasma; a sample stage on which the sample is placed; a first flat plate arranged above the sample stage and having a plurality of through holes; a second flat plate arranged between the first flat plate and the sample stage and facing the first flat plate; and a gas supply port arranged on a side surface of the processing chamber between the first flat plate and the second flat plate to supply gas. The through holes are arranged outside a portion separated from a center by a predetermined distance.

Advantageous Effect

According to the invention, it is possible to provide a plasma processing apparatus capable of implementing both a radical irradiation and an ion irradiation with one apparatus and of controlling the radical irradiation between a first shielding plate and a second shielding plate.

Problems to be solved, configurations, and effects other than those described above will be clarified by the following explanation of embodiments.

BRIEF DESCRIPTION OF DRAWINGS

FIG. 1 is a cross-sectional view showing an outline of a plasma processing apparatus.

FIG. 2 is a diagram schematically showing lines of magnetic force in the plasma processing apparatus.

FIG. 3 is a plan view showing an example of hole arrangement of a first shielding plate in an ECR plasma processing apparatus.

FIG. 4 is a plan view showing an example of hole arrangement of a second shielding plate in the ECR plasma processing apparatus.

FIG. 5 is a cross-sectional view of the apparatus showing a state in which a radical flow is controlled by a multi-gas.

FIG. 6A is a simulation diagram showing streamlines of a gas flow of a single shielding plate structure.

FIG. 6B is a diagram showing the relation between a radial position on a sample, gas pressure, and gas velocity in a comparative example.

FIG. 7A is a diagram showing contour lines of an actual etching rate performed by a plasma processing apparatus having a single shielding plate structure.

FIG. 7B is a graph showing an ER distribution in a comparative example.

FIG. 8A is a simulation diagram showing streamlines of a gas flow of a two-shielding plate structure.

FIG. 8B is a diagram showing the relation between a radial position on a sample, gas pressure, and gas velocity in the present embodiment.

FIG. 9A is a simulation diagram showing streamlines of a gas flow in which a second gas flow is added in the two-shielding plate structure.

FIG. 9B is a diagram showing the relation between the radial position on the sample, the gas pressure, and the gas velocity in the present embodiment.

DESCRIPTION OF EMBODIMENTS

Hereinafter, the invention will be described with reference to embodiments. FIG. 1 shows a schematic overall configuration cross-sectional view of a plasma processing apparatus according to the present embodiment. In the plasma processing apparatus of the present embodiment, by an interaction between a microwave (radio frequency power) of 2.45 GHz supplied from a magnetron 113, which is a radio frequency power source, to a vacuum processing chamber 106 via a rectangular waveguide 112 and a dielectric window 117, and a magnetic field formed by a solenoid coil 114, which is a magnetic field forming mechanism, plasma is generated in the vacuum processing chamber 106 by electron cyclotron resonance (ECR). Such a plasma processing apparatus is called an ECR plasma processing apparatus.

In addition, a radio frequency power source 123 is connected to a sample 121 placed on a sample stage 120 via a matching device 122. The inside of the vacuum processing chamber 106 is connected to a pump 124 via a valve 125, and internal pressure can be adjusted by an opening degree of the valve 125.

In addition, the plasma processing apparatus includes a first shielding plate (a first flat plate) 115 and a second shielding plate (a second flat plate) 116 made of a dielectric material inside the vacuum processing chamber 106. The second shielding plate 116 is installed in parallel below the first shielding plate 115 at an interval.

In the present embodiment, the first shielding plate 115 and the second shielding plate 116 are formed of a dielectric material. Since the first shielding plate 115 is made of a non-metallic material, a microwave can pass through the first shielding plate 115 and the second shielding plate 116 and propagate to the sample side.

The inside of the vacuum processing chamber 106 above the first shielding plate 115 is defined as an upper portion region 106-1, the inside of the vacuum processing chamber 106 between the first shielding plate 115 and the second shielding plate 116 is defined as a central portion region 106-2, and the inside of the vacuum processing chamber 106 below the second shielding plate 116 is defined as a lower portion region 106-3.

The plasma processing apparatus used in the present embodiment has such a characteristic that when the frequency of the microwave is 2.45 GHz, plasma can be generated in the vicinity of a magnetic flux density of 0.0875 T. Therefore, if the magnetic field is adjusted (defined as first control) such that a plasma generation region is located between the first shielding plate 115 and the dielectric window 117 (the upper portion region 106-1), plasma can be generated on the dielectric window 117 side of the first shielding plate 115, and as for generated ions, ions that passed through the first shielding plate 115 drift along lines of magnetic force, collide with a wall surface, and disappear, and thereby only radicals can be radiated to the sample 121. At this time, in the sample 121, an isotropic etching mainly including a surface reaction caused by radicals alone proceeds.

In contrast, if the magnetic field is adjusted (defined as second control) such that the plasma generation region is located between the second shielding plate 116 and the sample 121 (the lower portion region 106-3), plasma can be generated on the sample 121 side of the second shielding plate 116, and both ions and radicals can be supplied to the sample 121. At this time, in the sample 121, an anisotropic etching using an ion assist reaction, which promotes the reaction of radicals by ions, proceeds.

In addition, a control device 100 can be used to perform adjustment or switching (the upper portion or the lower portion) of a height position of the plasma generation region with respect to height positions of the first shielding plate 115 and the second shielding plate 116, adjustment of a period for remaining each height position, and switching of power supplied to each solenoid coil when there are a plurality of solenoid coils.

In addition, in the plasma processing apparatus, a first gas can be supplied through a first gas supply port 149 (see FIG. 2 described later). Furthermore, a second gas supply port 150 is provided on a peripheral wall of the vacuum processing chamber 106 to communicate with the central portion region 106-2 over the entire circumference. A second gas (an etched gas or an inert gas) can be supplied to the central portion region 106-2 between the first shielding plate 115 and the second shielding plate 116 via the second gas supply port 150. Due to this feature, when plasma is generated in the upper portion region 106-1, the gas flow and the radical distribution can be controlled in the middle portion region 106-2.

In the present embodiment, since ions drift to the outside when ECR plasma is used, positions of through holes (see FIGS. 3 and 4 described later) of the first shielding plate 115 and the second shielding plate 116 can be freely set.

Next, the influence of the arrangement of the through holes of the shielding plates on the performance of shielding ions in the plasma processing apparatus of the present embodiment will be described.

First, the ion shielding effect will be described. It is known that ions move along the lines of magnetic force in plasma having a magnetic field. FIG. 2 is a longitudinal cross-sectional view showing a state of lines of magnetic force 140 in the plasma processing apparatus shown in FIG. 1. In the case of ECR plasma, as shown in FIG. 2, the lines of magnetic force 140 are traveling in a vertical (upper-lower) direction, and the distance between the lines of magnetic force is widened as further approaching the sample.

Therefore, when through holes 170 are uniformly arranged on an entire surface of the first shielding plate 115, ions that have passed through the through holes 170 near the center are radiated on the sample 121 along the lines of magnetic force 140. In contrast, the first shielding plate 115 of the present embodiment has a plurality of through holes 170 in a range equal to or larger than the diameter of the sample 121 (outside of a portion separated from the center by a predetermined distance). That is, by creating a structure (a radical shielding region) having no through hole in a range (a range in which the sample 121 is projected in the upper-lower direction) 151 that is equivalent to the sample diameter at a center portion of the first shielding plate 115, which is shown by a dotted line in FIG. 3, it is possible to completely shield ions generated on the dielectric window side (the upper portion region 106-1) of the first shielding plate 115 from being radiated on the sample. In addition, the diameter of the through holes 170 is preferably φ1 to 2 cm.

Furthermore, when only the first shielding plate 115 having no through hole near the center portion as shown in FIG. 3 is used without providing the second shielding plate 116, a processing gas in the central portion region 106-2 is supplied from the radially outer through holes provided in the first shielding plate 115, and therefore, the radical distribution tends to be high on the outer peripheral side in the vicinity of the sample 121. In order to solve this problem, in the present embodiment, the second shielding plate 116 in which through holes 171 as shown in FIG. 4 are arranged is arranged below the first shielding plate 115.

Since the ions drift along the lines of magnetic force (deviate outward in the radial direction as approaching the sample 121), the second shielding plate 116 is provided with the through holes 171 inside and outside the range 151 that is equivalent to the sample diameter. In the example of FIG. 4, the through holes 171 are arranged only inside the range 151. In addition, when sizes of the through holes 171 are made uniform, a large number of radicals are generated on the outside of the wafer in the vicinity of the sample stage. In order to solve this problem, it is preferable to set the diameter of the through holes 171 near the center of the second shielding plate 116 larger than the diameter of the through holes 171 near the outer circumference (or to reduce the diameter of the through holes 171 as the distance from the center increases). Since the ions drift along the lines of magnetic force, the ions can be shielded by a shielding plate having through holes in a diameter range equal to or larger than that of the wafer. In FIG. 4, although a plurality of through holes 171 are provided inside the range 151 corresponding to the diameter of the sample 121, there is no problem to be solved even when they are provided in a range equal to or larger than the diameter of the sample 121. In addition, there is no problem to be solved even when the through holes 171 are provided in a shade of the first shielding plate 115.

FIG. 6A is a simulation diagram showing streamlines of a gas flow of a plasma processing apparatus having a single shielding plate structure as a comparative example. FIG. 6B is a diagram showing the relation between a radial position on the sample 121, gas pressure, and gas velocity in the comparative example.

In the comparative example, only the first shielding plate 115 as shown in FIG. 3 is arranged in the vacuum processing chamber 106. In such a case, as shown in FIG. 6A, the streamlines of the gas pass outside the sample (wafer radius) in the vicinity of the sample. Since the radicals are supplied from the outside of the wafer toward the center, the radicals tend to be excessive on the outside and insufficient on the center side. Therefore, the etching distribution tends to be high on the outer peripheral side.

FIG. 7A is a diagram showing contour lines of an actual etching rate performed by the plasma processing apparatus having a single shielding plate structure as a comparative example. FIG. 7B is a graph showing the ER (etching rate) distribution, and shows the relation between the radius and the etching rate in each direction, with the west direction being 0 degree, the northwest direction being 45 degrees, the north direction being 90 degrees, and the northeast direction being 135 degrees when FIG. 7A is oriented by north, south, east, and west. According to FIGS. 7A and 7B, it is understood that the radicals tend to be excessive on the outside of the wafer and insufficient on the center.

Therefore, in the present embodiment, a gas flow route is changed by arranging the second shielding plate 116 as shown in FIG. 4 below the first shielding plate 115. By changing the gas flow route, a required number of radicals are supplied from the center of the sample 121 to the outside, and excess radicals are exhausted along the gas flow so that the etching distribution becomes uniform. In addition, the etching rate is increased by supplying a sufficient number of radicals.

FIG. 8A is a simulation diagram showing streamlines of a gas flow of a plasma processing apparatus having a two-shielding plate structure as the present embodiment. FIG. 8B is a diagram showing the relation between a radial position on the sample 121, gas pressure, and gas velocity in the present embodiment. It is clear when compared with FIGS. 6A and 6B, and it is understood that the gas flow route is changed as shown in FIGS. 8A and 8B, and the required number of radicals are supplied from the center of the wafer to the outside.

In addition, in the plasma processing apparatus, since the ions drift outward along the lines of magnetic force, it is not necessary to arrange the through holes of the first shielding plate 115 and the second shielding plate 116 not to overlap each other.

Next, regarding the plasma processing apparatus of the present embodiment, the influence of a second gas flow arranged in the central portion region 106-2 on the radical distribution will be described.

As described above, the embodiment in which the streamlines of the gas are changed by using two shielding plates is described. However, even when the through holes 171 of the second shielding plate 116 are enlarged toward the center, a pressure difference between the center and a portion outside the wafer in the vacuum processing chamber 106 is large and the gas flow cannot be drawn into the center. In such a case, by installing the second gas supply port 150 as shown in FIGS. 1 and 2, gas is supplied through the through holes 171 at the center of the second shielding plate 116.

Here, in order to make the gas pressure uniform, it is preferable that the shape of the second gas supply port 150 is a slit shape. As shown in FIG. 5, the flow of the gas supplied from the first shielding plate 115 can be corrected by gas ejected from the second gas supply port 150. The gas supplied to the upper portion processing chamber is turned into plasma, and dissociated radicals move to the central portion region 106-2 through the first shielding plate 115. At this time, the flow is separated from the upper surface of the second shielding plate 116 by the second gas flow. Thereafter, the gas of which the uniformity is corrected enters the lower portion region 106-3 through the through holes of the second shielding plate 116.

In particular, in the present embodiment, the gas is supplied through the second gas supply port 150 in order to correct the flow of the radicals.

Next, regarding the plasma processing apparatus of the present embodiment, the influence of the second gas flow supplied to the central portion region 106-2 on particles in the processing chamber will be described.

When the through holes 170 of the first shield plate 115 are arranged above a structural portion of the second shield plate 116, it is considered that a product generated in the upper portion region 106-1 is deposited through the through holes 170 on the structural portion of the second shielding plate 116. In this case, it is considered that the gas supplied from the first shielding plate 115 flies the product up and the product drops on the wafer and becomes particles.

Therefore, as shown in FIGS. 1 and 2, by directing the second gas supply port 150 upward (directing the axis of the second gas supply port 150 from the horizontal direction toward the first shielding plate 115 side, in other words, tilting the side surface of the vacuum processing chamber 106 at a predetermined angle with respect to the vertical direction), it is possible to prevent the gas from being ejected directly below the through holes 170 and prevent the product from flying up.

FIG. 9A is a simulation diagram showing streamlines of a gas flow when gas is supplied upward from the second gas supply port 150 to the plasma processing apparatus having the of two-shielding plate structure as the present embodiment. FIG. 9B is a diagram showing the relation between the radial position on the sample 121, the gas pressure, and the gas velocity in the present embodiment.

According to FIGS. 9A and 9B, it is confirmed that adding an upward gas flow to the central portion region 106-2 has an effect of raising a gas flow route upward as compared with a case where no gas flow is added to the central portion region.

In particular, in the present embodiment, the direction of the gas flow can be controlled to prevent particles.

The embodiment is described in detail for easy understanding of the invention, and does not necessarily limit the invention to those having all the described configurations. In addition, it is possible to replace apart of a configuration of one embodiment with a configuration of another embodiment, and it is also possible to add a configuration of another embodiment to a configuration of one embodiment. Further, it is possible to add, delete, and replace a part of a configuration of each embodiment with another configuration.

REFERENCE SIGN LIST

106-1 upper portion region of processing chamber
106-2 central portion region of processing chamber
106-3 lower portion region of processing chamber
112 circular waveguide
113 magnetron
114 solenoid coil
115 first shielding plate
116 second shielding plate
117 dielectric window (top plate)
120 sample stage
121 sample (wafer)
122 matching device
123 radio frequency power source
124 pump
140 lines of magnetic force
149 first gas supply port
150 second gas supply port
151 range in which no through hole is provided (radical shielding region)
170 through hole
171 through hole

The invention claimed is:

1. A plasma processing apparatus comprising:
   a processing chamber in which a sample is subjected to plasma-processing;
   a radio frequency power source that supplies radio frequency power for generating plasma;
   a sample stage on which the sample is placed;
   a first flat plate arranged above the sample stage and having a first plurality of through holes each disposed only in a peripheral area portion of the first flat plate so as to not overlap with the sample stage in a plan view;

a second flat plate arranged between the first flat plate and the sample stage and facing the first flat plate and having a second plurality of through holes, wherein each of the second plurality of through holes is disposed only in a central area portion of the second flat plate that is inside of and does not overlap with the first plurality of through holes disposed at the peripheral area portion of the first flat plate in the plan view; and a gas supply port arranged on a side surface of the processing chamber between the first flat plate and the second flat plate to supply gas, wherein the first flat plate and the second flat plate are spaced apart from each other and from the sample stage, the first plurality of through holes of the first plate and the second plurality of through holes of the second plate that do not overlap at the peripheral area portion of the first flat plate or at the central area portion of the second flat plate in the plan view, and the gas supply port are arranged to control a gas flow of the supplied gas to cause an etching distribution of a flow of radicals across a surface of the sample to be uniform.

2. The plasma processing apparatus according to claim 1, wherein the gas supply port is tilted at a predetermined angle with respect to a vertical direction of the side surface of the processing chamber.

3. The plasma processing apparatus according to claim 2, wherein the plurality of second through holes of the second flat plate is arranged so that a diameter of each said second through hole is reduced as a distance from a center increases.

4. The plasma processing apparatus according to claim 3, further comprising:

a magnetic field forming mechanism that forms a magnetic field in the processing chamber, wherein a material of the first flat plate and the second flat plate is a dielectric material.

5. The plasma processing apparatus according to claim 2, further comprising:

a magnetic field forming mechanism that forms a magnetic field in the processing chamber, wherein a material of the first flat plate and the second flat plate is a dielectric material.

6. The plasma processing apparatus according to claim 1, wherein the plurality of second through holes of the second flat plate is arranged so that a diameter of each said second through hole is reduced as a distance from a center increases.

7. The plasma processing apparatus according to claim 1, further comprising:

a magnetic field forming mechanism that forms a magnetic field in the processing chamber, wherein a material of the first flat plate and the second flat plate is a dielectric material.

8. The plasma processing apparatus according to claim 6, further comprising:

a magnetic field forming mechanism that forms a magnetic field in the processing chamber, wherein a material of the first flat plate and the second flat plate is a dielectric material.

* * * * *